(12) United States Patent
Mono et al.

(10) Patent No.: US 7,618,867 B2
(45) Date of Patent: Nov. 17, 2009

(54) METHOD OF FORMING A DOPED PORTION OF A SEMICONDUCTOR AND METHOD OF FORMING A TRANSISTOR

(75) Inventors: Tobias Mono, Dresden (DE); Frank Jakubowski, Dresden (DE); Hermann Sachse, Dresden (DE); Lars Voelkel, Dresden (DE); Klaus-Dieter Morhard, Dresden (DE); Dietmar Henke, Radebeul (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/493,028

(22) Filed: Jul. 26, 2006

(65) Prior Publication Data

US 2008/0026530 A1    Jan. 31, 2008

(51) Int. Cl.
*H01L 21/336* (2006.01)
*H01L 21/425* (2006.01)
*H01L 21/22* (2006.01)

(52) U.S. Cl. .............. 438/302; 438/525; 438/531; 438/551; 257/E21.149; 257/E21.147

(58) Field of Classification Search ........ 428/250, 428/302, 525, 531, 551; 257/E21.148, E21.149, 257/E21.147
See application file for complete search history.

(56) References Cited

U.S. PATENT DOCUMENTS

| | | | |
|---|---|---|---|
| 3,873,371 A * | 3/1975 | Wolf | 438/144 |
| 5,891,774 A * | 4/1999 | Ueda et al. | 438/264 |
| 6,008,094 A | 12/1999 | Krivokapic et al. | |
| 6,329,235 B1 | 12/2001 | Kuo | |
| 6,573,137 B1 | 6/2003 | Divakaruni et al. | |
| 6,624,035 B1 * | 9/2003 | Luning et al. | 438/302 |
| 6,727,135 B2 | 4/2004 | Lee et al. | |
| 6,750,116 B1 | 6/2004 | Chen | |
| 6,897,514 B2 | 5/2005 | Kouznetsov et al. | |
| 7,078,750 B2 * | 7/2006 | Hareland et al. | 257/288 |
| 7,316,978 B2 * | 1/2008 | Lee et al. | 438/703 |
| 2002/0117704 A1 | 8/2002 | Gonzalez | |
| 2005/0142771 A1 | 6/2005 | Kim | |

FOREIGN PATENT DOCUMENTS

| | | |
|---|---|---|
| EP | 0977266 A1 | 2/2000 |
| EP | 1420457 A1 | 5/2004 |
| JP | 2003045819 A | 2/2003 |
| JP | 2006135000 A | 5/2006 |

* cited by examiner

*Primary Examiner*—Alexander G Ghyka
*Assistant Examiner*—Seahvosh J Nikmanesh
(74) *Attorney, Agent, or Firm*—Edell, Shapiro & Finnan, LLC

(57) ABSTRACT

A method of forming a doped portion of a semiconductor substrate includes: defining a plurality of protruding portions on the substrate surface, the protruding portions having a minimum height; providing a pattern layer above the substrate surface; removing portions of the pattern layer from predetermined substrate portions; performing an ion implantation procedure such that an angle of the ions with respect to the substrate surface is less than 90°, wherein the ions are stopped by the pattern layer and by the protruding portions, the predetermined substrate portions thereby being doped with the ions; and removing the pattern layer.

25 Claims, 10 Drawing Sheets

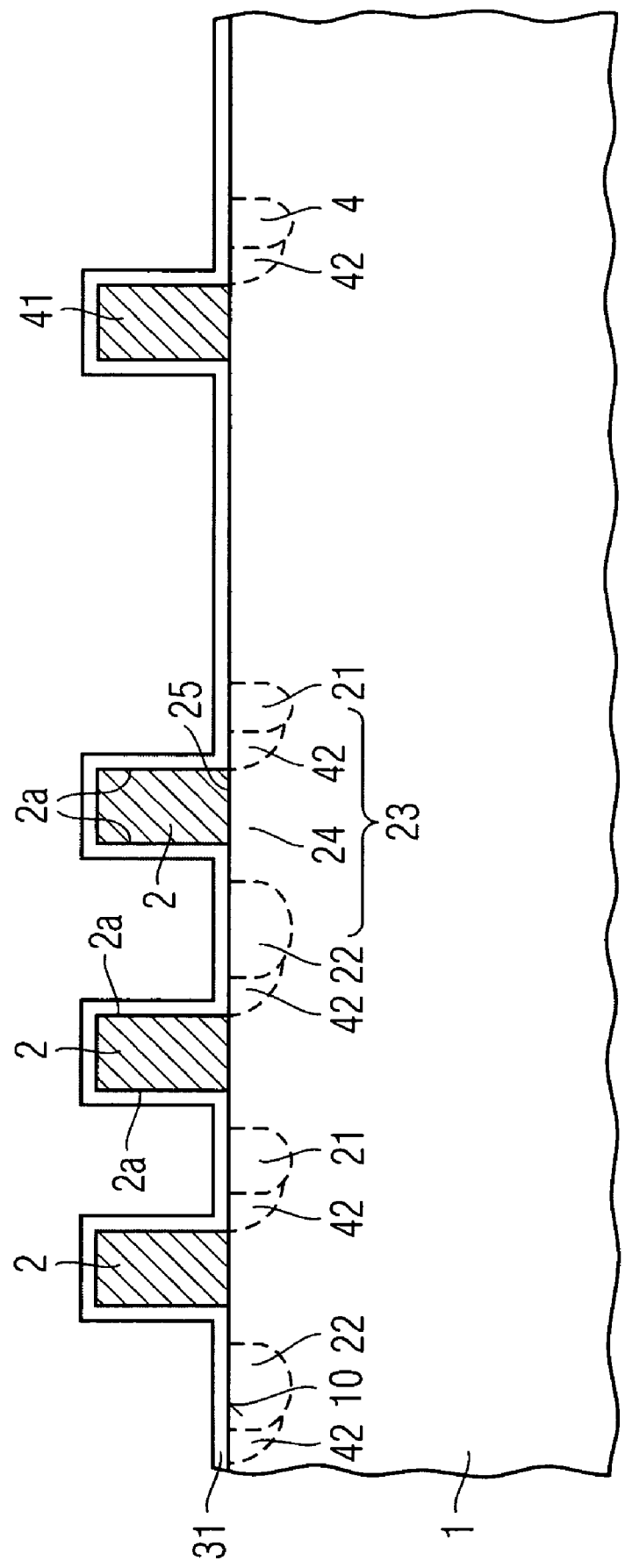

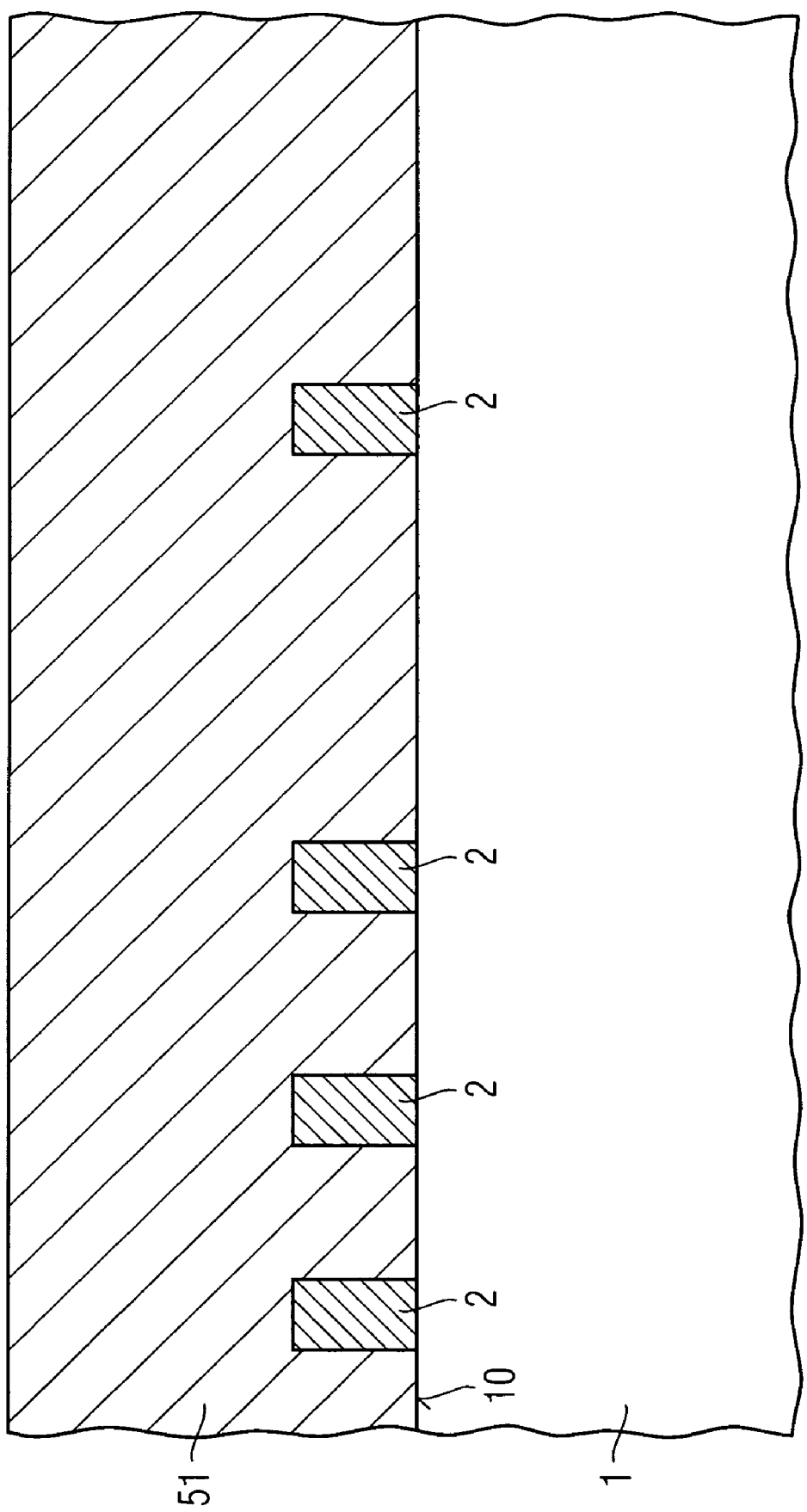

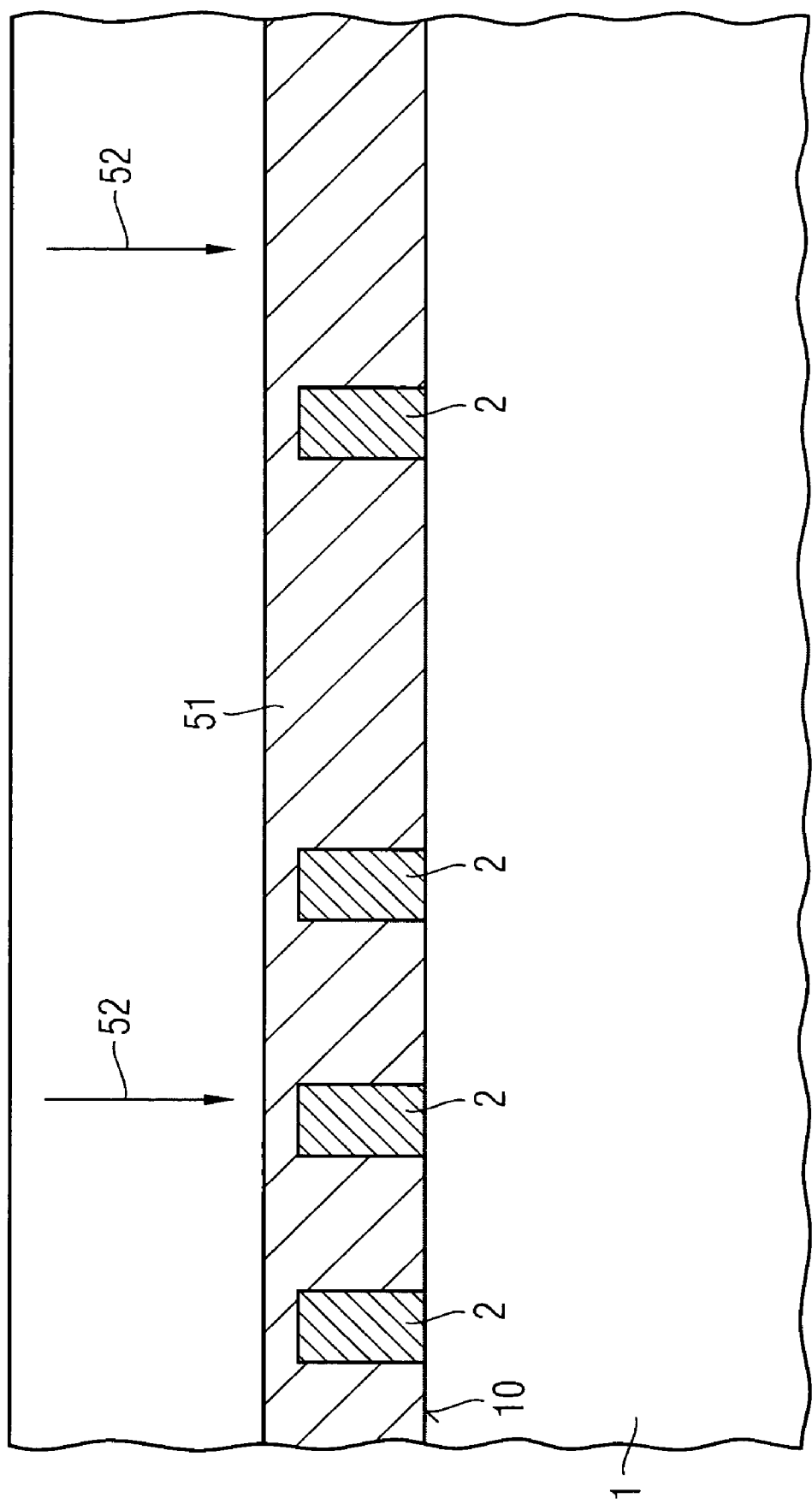

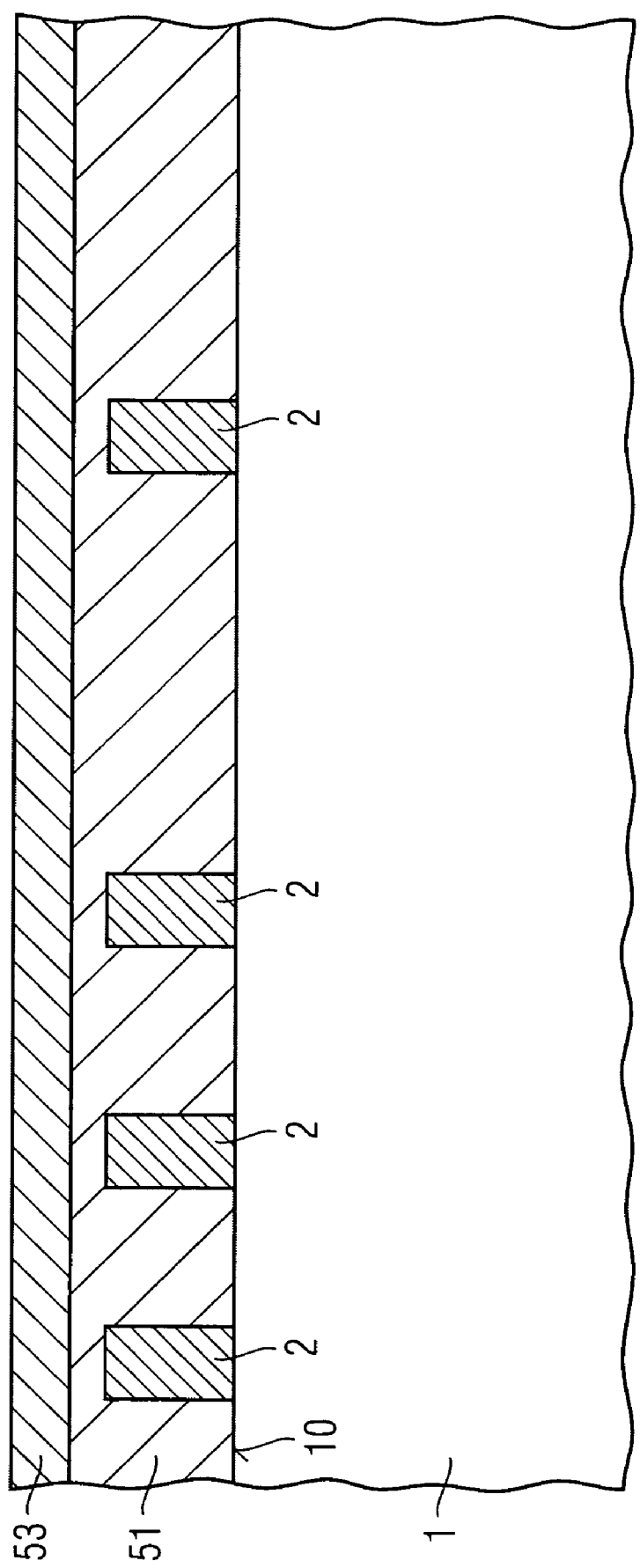

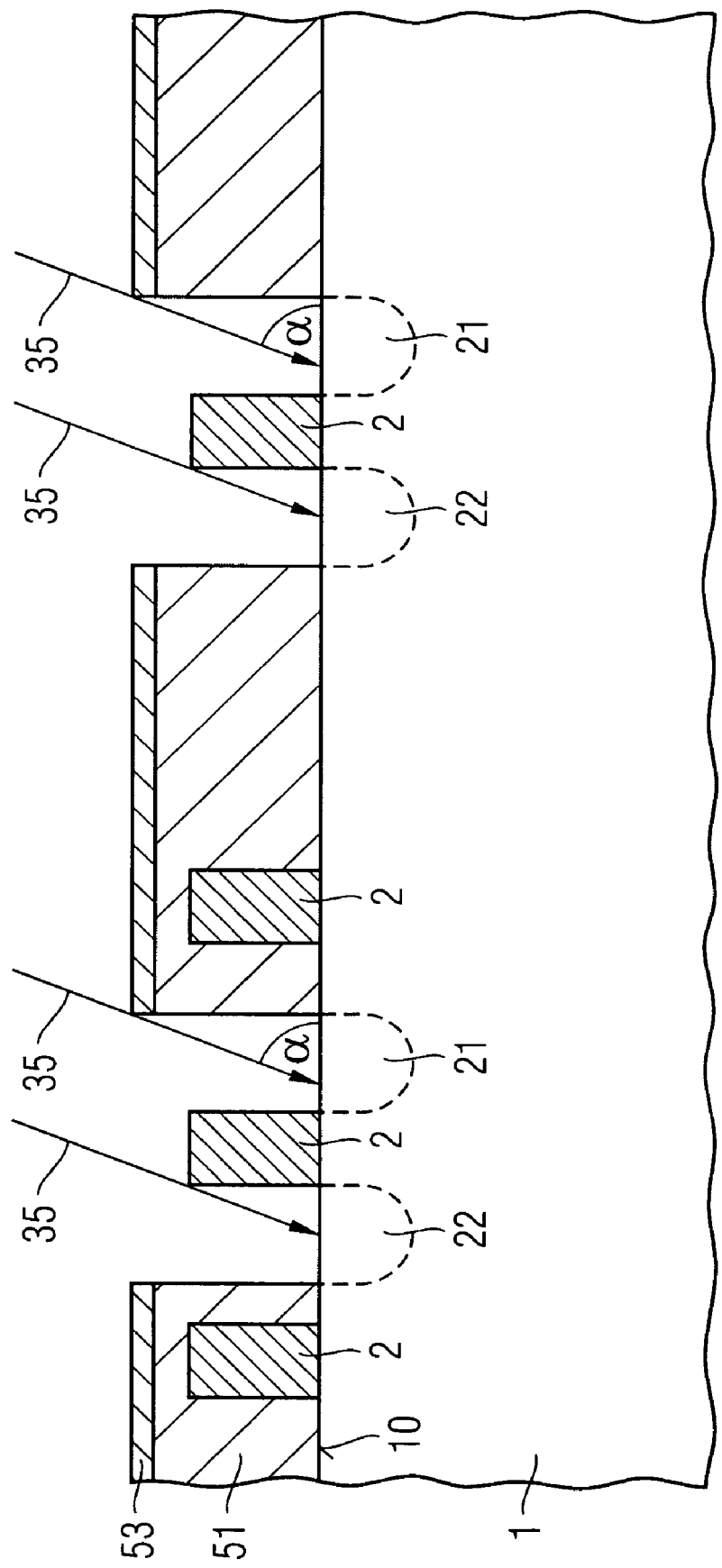

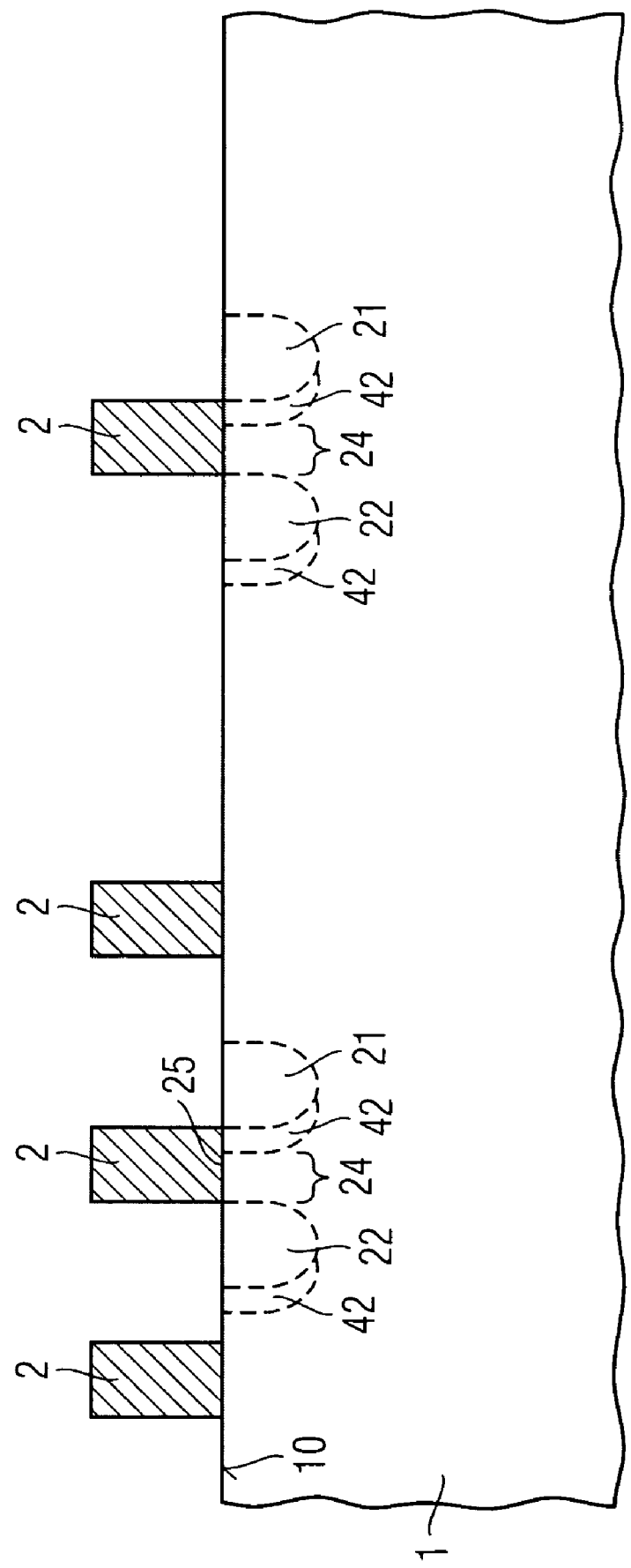

METHOD OF FORMING A DOPED PORTION OF A SEMICONDUCTOR AND METHOD OF FORMING A TRANSISTOR

FIELD OF THE INVENTION

The present invention relates to a method of forming a doped portion as well as to a method of forming a transistor.

BACKGROUND

Although in the following, mainly memory devices and their manufacturing method are explained as an illustrative example, the invention can be applied to a broad scope of semiconductor devices, including, but not limited to memories, logic and wireless applications. Since tilted implants are mainly used to define the properties of MOS transistors, a preferred field of application of the invention is, e.g., halo implants of transistors. For example, these transistors may be surrounded by a patterned area comprising patterns in which pattern densities are locally varying over the chip. However, the invention is not limited to DRAM. The tilted implants may even have other functions than the definition of halo implants, such as, e.g., the definition of contacts, the definition of single sided buried straps, contact implants and others. Descriptions in the later text citing the formation of a transistor structure are not meant to narrow the applicability of the invention.

Memory devices such as dynamic random access memories (DRAM), non-volatile memories and other well known memory devices generally comprise a memory cell array as well as a peripheral portion in which circuits for driving the memory cell array and for performing reading and writing operations are disposed. Usually, the circuits in the peripheral portion as well as each of the memory cells comprise transistors which are at least partially formed in a semiconductor substrate. Generally, each of these transistors comprises a first and a second source/drain region, a channel which is disposed between the first and second source/drain regions and a gate electrode. The gate electrode controls the conductivity of the channel. A transistor may further comprise a halo doped portion which is disposed between the channel and the first and second source/drain regions. The halo doped portion is doped with a dopant of a conductivity type which is opposite to the conductivity type of the first and second source/drain regions. This halo doped portion suppresses short-channel effects.

Usually, for forming an array transistor or peripheral transistor, first, the gate electrodes are formed by patterning a conductive layer stack. Thereafter, doping steps are performed for defining the first and second source/drain portions. In particular, this doping step usually is performed as an ion implantation step. During this ion implantation step, the gate electrodes as well as a patterned photoresist layer are taken as an implantation mask so that the ions are implanted only in predetermined substrate portions.

To illustrate the effects typically visible when performing a tilted implant on a wafer having protruding portions of varying density over a wafer surface, FIG. 1 shows an exemplary cross-sectional view of a semiconductor substrate 1. On the surface 10 of the semiconductor substrate 1, gate electrodes 2 as an example of protruding portions are disposed. In particular, the gate electrodes 2 have been defined by a conventional method, in which, first, a layer stack comprising at least one conductive layer, is deposited and patterned in accordance with the circuitry to be formed. On top of the resulting surface, thereafter, a photoresist layer 34 is deposited and patterned so that portions of the substrate surface 10 are uncovered. Usually, after correspondingly patterning the photoresist layer 34, a tilted ion implantation step is performed taking the photoresist mask 34 as well as the gate electrodes 2 as a shadowing mask.

Thereby, the halo doped portion 42 as is shown in FIG. 1 is defined. As can be gathered from FIG. 1, the lateral extent of the doped portion depends on the height h of the photoresist layer 34.

SUMMARY

The present invention provides a method of forming a doped portion, comprising providing a semiconductor substrate having a surface, defining a plurality of protruding portions on the substrate surface, the protruding portions having a minimum height, providing a pattern layer above the substrate surface, removing portions of the pattern layer from predetermined substrate portions, performing an ion implantation step, wherein an angle of the ions with respect to the substrate surface is less than 90°, wherein the ions are stopped by the pattern layer and by the protruding portions, the predetermined substrate portions being doped with the ions, and removing the pattern layer.

Moreover, one method of forming a transistor according to the invention comprises providing a semiconductor substrate having a surface, providing a gate electrode on the substrate surface, providing a pattern layer above the substrate surface, removing portions of the pattern layer from predetermined positions, forming a first and a second source/drain region in the semiconductor substrate, performing an angled ion implantation step wherein an angle of the ions with respect to the substrate surface is less than 90°, wherein the ions are stopped by the pattern layer and by the gate electrode, predetermined substrate portions being doped with the ions, and removing the pattern layer.

The above and still further features and advantages of the present invention will become apparent upon consideration of the following definitions, descriptions and descriptive figures of specific embodiments thereof wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The accompanying drawings are included to provide a further understanding of the present invention and are incorporated in and constitute a part of the specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 5 shows a cross-sectional view of the substrate after performing the angled ion implantation step;

FIG. 6 shows a cross-sectional view of the substrate when performing the method according to another embodiment of the present invention;

FIG. 7 shows a cross-sectional view of the substrate after performing a further processing step;

FIG. 8 shows a cross-sectional view of the substrate after depositing an imaging layer;

FIG. 9 shows a cross-sectional view of the substrate when performing an angled ion implantation step; and FIG. 10 shows a cross-sectional view of the completed array of transistors.

DETAILED DESCRIPTION

In the following detailed description, reference is made to accompanying drawings which form a part hereof and in which is illustrated by way of illustration, specific embodiments in which the invention may be practiced. In this regard, directional terminology such as "top", "bottom", "front", "back", "leading", "trailing", etc. is used with reference to the orientation of the Figures being described. Because components of the embodiments of the present invention can be positioned in a number of different orientations, the directional terminology is used for purposes of illustration and is no way limiting. It is to be understood that other embodiments may be utilized and structural or logical changes will be made without departing from the scope of the present invention. The following detailed description, therefore, is not being taken in a limiting sense, and the scope of the present invention is defined by the appended claims.

Figure 1:
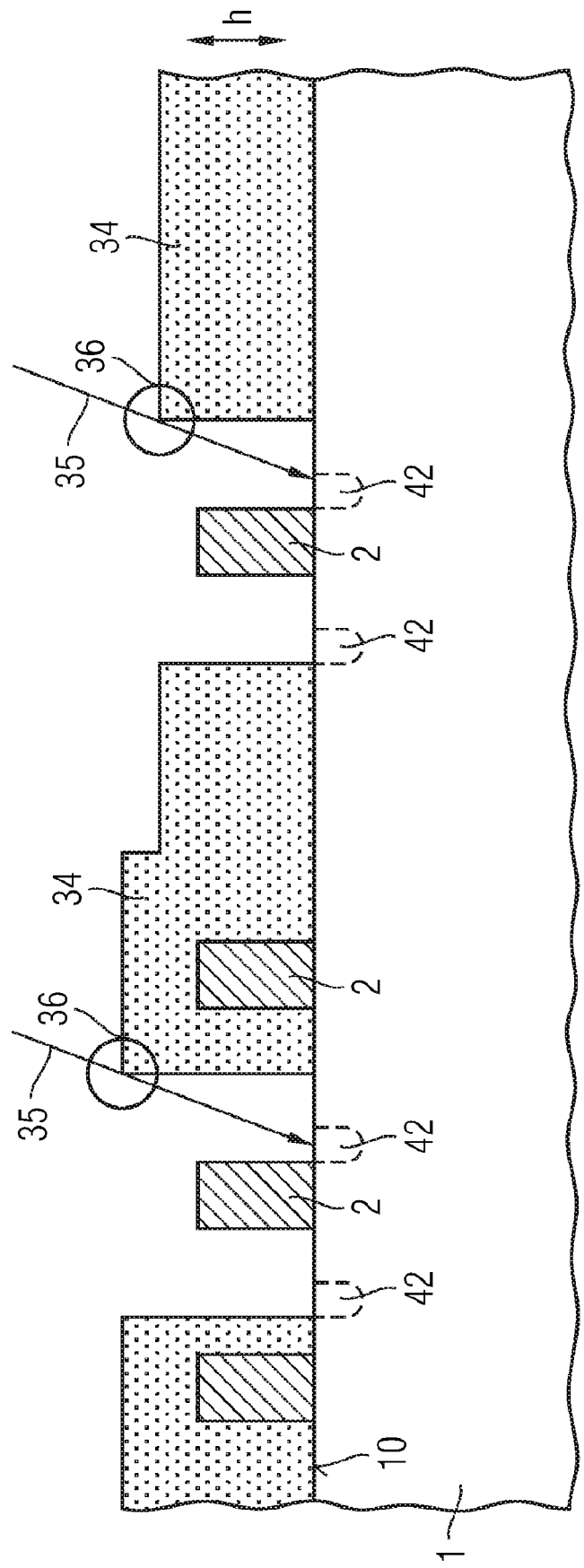
FIG. 1 shows a cross-sectional view of a conventional ion implantation method.
Figure 2:
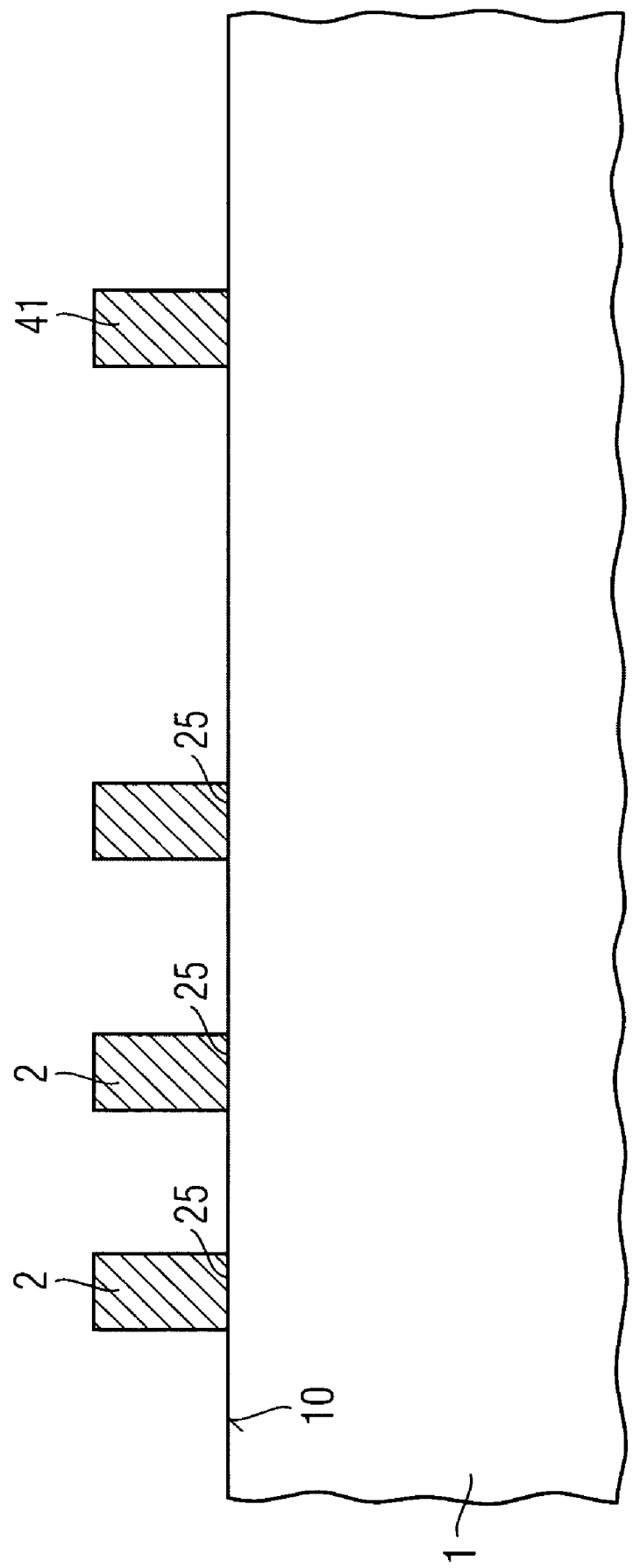
FIG. 2 shows a cross-sectional view of a substrate after performing a first step of the method of the present invention.

FIGS. 2 to 5 show a first embodiment of the present invention. As is shown in FIG. 2, first, a plurality of protruding portions is defined on the surface of a substrate 1. The semiconductor substrate 1 can in particular be a silicon substrate which may, e.g., be p-doped. Other doped portions can be provided in the semiconductor substrate 1, and, in addition, further components can be defined in the substrate. On the surface 10 of the substrate surface 1, arbitrary kinds of protrusions may be formed. For example, if a transistor is to be formed, preferably, the protruding portions are the gate electrodes 2 of the transistors to be formed. The gate electrodes 2 can be defined by, first, depositing a gate insulating layer 25 on the substrate surface 10, followed by a conductive layered stack. Thereafter, the layer stack is patterned, e.g., by using a photolithographic method as is generally known. As a result, as is shown in FIG. 2, protruding portions 2, 41 are formed on the surface 10 of the semiconductor substrate 1. The gate electrodes 2 can have, e.g., a height of 100 to 500 nm and a minimum distance of 20 to 120 nm from each other.

According to an embodiment of the invention, first, a sacrificial layer, in particular, a spacer layer which is made of an insulating material such as silicon dioxide which is formed by using TEOS (tetraethylorthosilicate) as a starting material is deposited. The silicon dioxide layer 31 can have, e.g., a thickness of approximately 5 to 30 nm, e.g., 10 nm.

Figure 3:
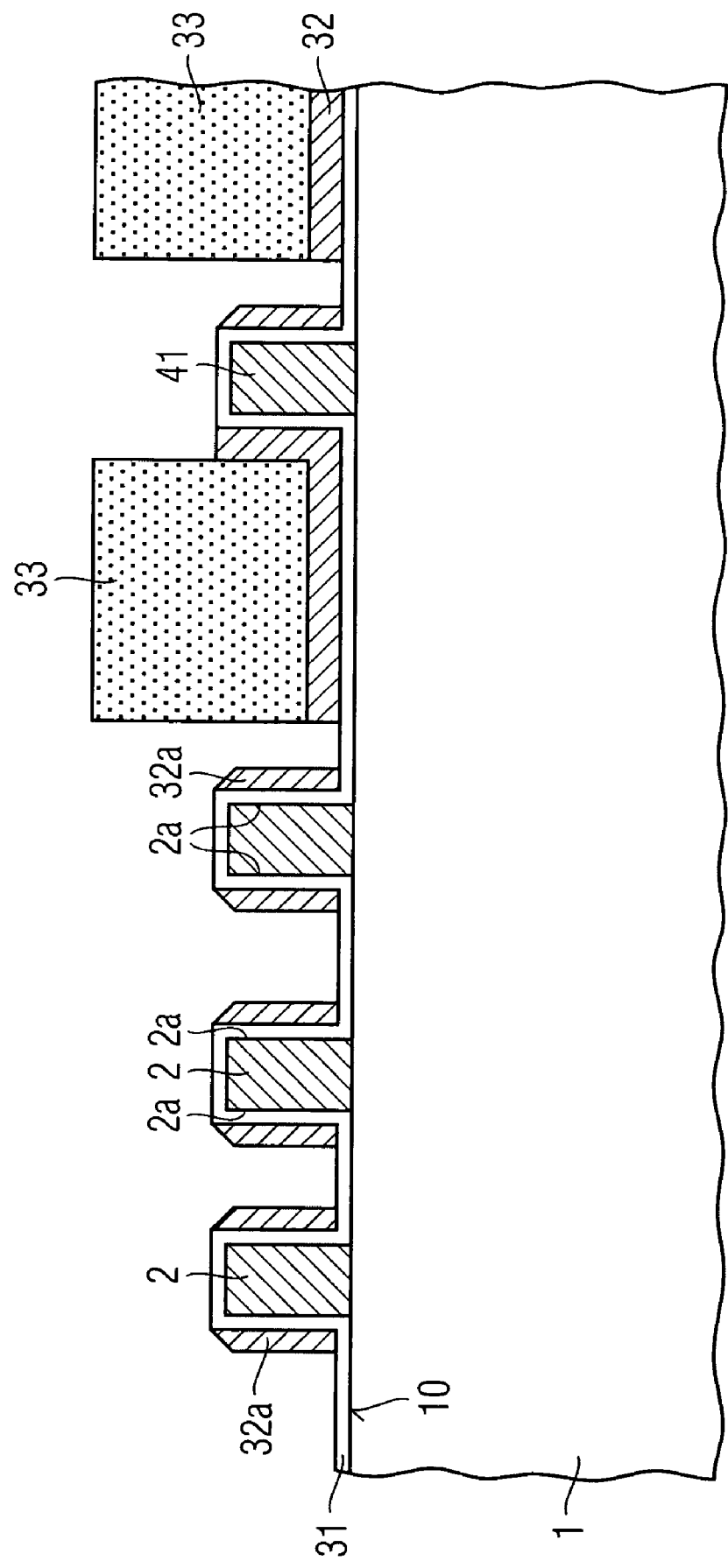
FIG. 3 shows a cross-sectional view of the substrate after performing a further step of the method of the present invention.

Thereafter, a pattern layer 32 is deposited. The pattern layer has, for example, a thickness of 5 to 10 nm. The material of the pattern layer can be arbitrarily selected. Nevertheless, the material of the pattern layer 32 should be able to be etched selectively with respect to the sacrificial layer. Silicon nitride, for example, can be chosen as the material of the sacrificial layer. Further examples comprise tungsten or TiN. As is shown in FIG. 3, e.g., the sacrificial layer 31 as well as the pattern layer 32 may preferably be deposited conformally on the surface 10 of the semiconductor substrate 1. As a result, the thickness of the pattern layer is homogenous and independent from the pattern density of the protruding portions.

Thereafter, a photoresist layer 33 is deposited on the resulting surface and patterned using a standard photolithographic method. Taking the patterned photoresist layer 33 as an etching mask, in the next step the pattern layer 32 is patterned in accordance with the pattern of the photoresist mask 33. An anisotropic etching step, for example, can be performed so that only the horizontal portions of the pattern layer 32 are removed; vertical portions of the pattern layer 32 remaining on the sidewalls of the gate electrodes 2. Nevertheless, the etching step for etching the pattern layer can as well be an isotropic etching step.

The resulting structure is shown in FIG. 3. As can be seen, gate electrodes 2 are formed on the surface 10 of the semiconductor substrate. A silicon dioxide layer 32 is conformally deposited on the surface of the semiconductor substrate 1 including the gate electrodes 2. Moreover, $Si_3N_4$ spacers 32a are formed on the sidewalls 2a of the gate electrodes. Part of the surface is covered with the photoresist layer 33. As can be seen, the thickness of the photoresist layer 33 is much larger than the thickness of the sacrificial layer 31 and the thickness of pattern layer 32.

In the next step, the remaining portions of the photoresist layer 33 are removed. Optionally, the exposed portions of the sacrificial layer may be removed completely or partially. For example, the upper portion of the sacrificial layer may be removed so that approximately 1 to 2 nm of the sacrificial layer remains. Thereafter, an ion implantation step is performed so as to provide the first and second source/drain regions. For example, this doping step comprises an ion implantation step wherein the ions impinge perpendicularly onto the substrate surface 10. Thereby, the first and second source/drain regions are provided. During this ion implantation step the gate electrodes as well as the portions of the pattern layer 32 are taken as an implantation mask. The ion implantation step with the ions impinging perpendicularly with respect to the substrate surface is performed using n dopants, e.g., P or As ions. Thereafter, an angled implantation step is performed, using p dopants, e.g., B or $BF_2$ ions. An exemplary energy amount of the ions is approximately 10 keV. This angled ion implantation step provides a halo doping of the substrate.

Figure 4:
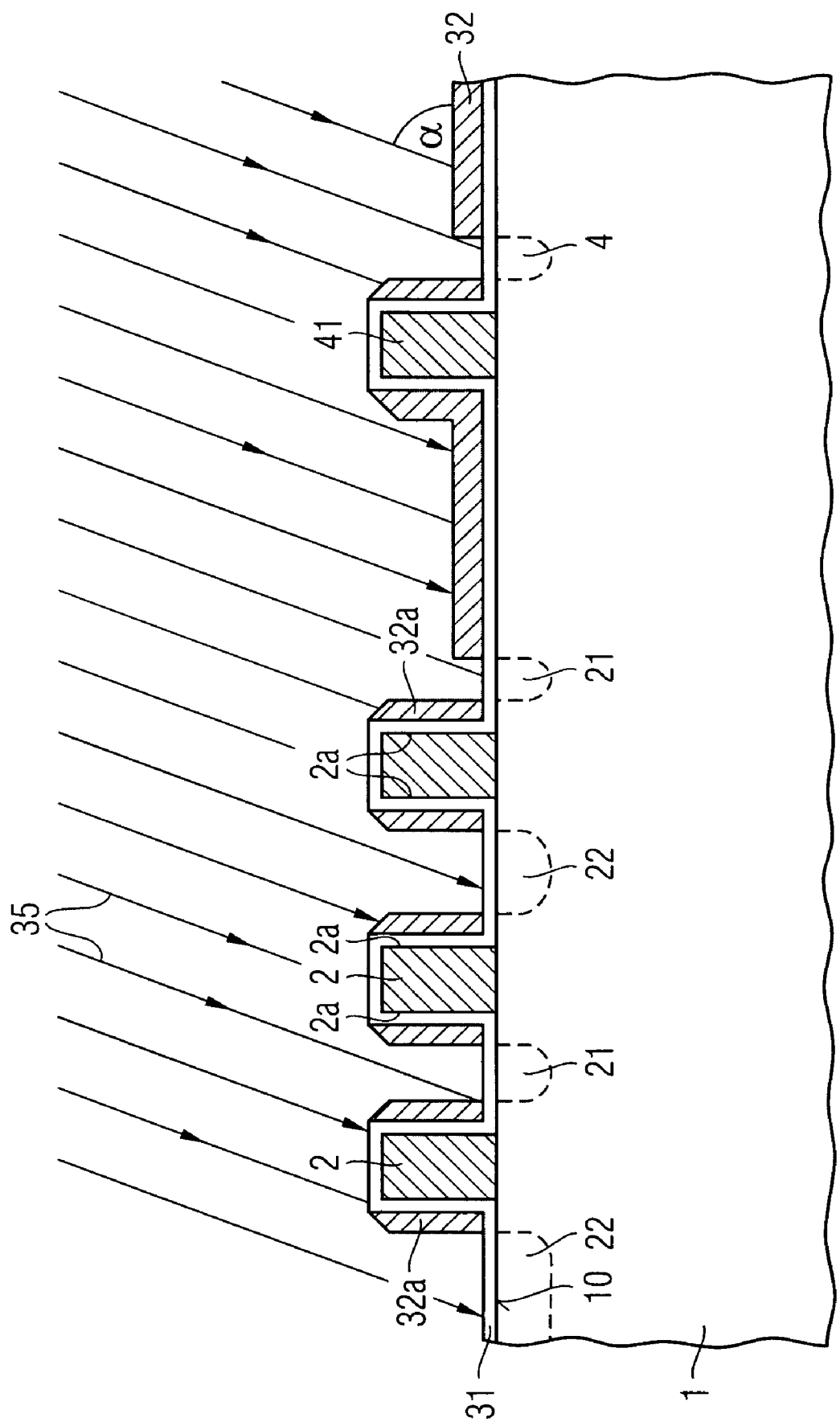
FIG. 4 shows a cross-sectional view of the substrate when performing an angled ion implantation step.

FIG. 4 shows a cross-sectional view of the substrate during this ion implantation step. As can be seen, the ions 35 impinge at an angle α onto the substrate surface. For example, the angle α may be 55 to 75°. According to an embodiment of the invention, the angle α of the ions with respect to the substrate surface may be 55 to 70°, e.g., 62°. As can be seen from FIG. 4, the ions are stopped by the pattern layer 32 and by the protruding portions 2. Nevertheless, the ions penetrate through the sacrificial layer 31. As can be gathered from FIG. 4, by adjusting the angle α of the ions and by adjusting the thickness of the pattern layer 32 as well as by defining openings in the pattern layer 32, the position and the lateral extension of the halo doped regions 42 can be adjusted.

Thereafter, the pattern layer 32 is removed. In particular, if silicon nitride is taken as the material of the pattern layer 32, the silicon nitride mask can be removed with hot phosphoric acid.

Accordingly, FIG. 5 shows a cross-sectional view of the completed array of transistors 23. For example, a transistor 23 as shown in FIG. 5 comprises a first source/drain region 21, a second source/drain region 22 as well as a channel 24 which is disposed between the first and second source/drain regions.

The first and second source/drain regions 21, 22 are adjacent to the substrate surface 10. A gate electrode 2 is disposed above the channel 24 and insulated from the channel by a gate insulating layer 25. The gate electrode 2 controls the conductivity of the channel 24. A halo doped region 42 is disposed adjacent to the first source/drain region 21 at a position next to the gate electrode 2. The lateral extension of the halo doped region 42 has been adjusted by the thickness of the sidewall spacer corresponding to the sum of the thicknesses of the sacrificial layer 31 and the thickness of the pattern layer 32. On the other side, the lateral extension of the halo doped region 42 is adjusted by the thickness of the pattern layer 32 and the angle of the angled ion implantation step. As can be seen in the right hand portion of FIG. 5, there is also a halo doped region 42 which is disposed between the doped portion 4 and the protruding portion 41. Also in this case the lateral extension of the halo doped region 42 is adjusted by the thicknesses of the sacrificial layer 31, the thickness of the pattern layer 32, and, on the other side, by the thickness of the pattern layer 32 and the angle α of the ion implantation step.

Although the method of the present invention has been described in combination with a method of forming a transistor, it is clearly to be understood that the method of forming a doped region of a substrate can be used for forming any kind of doped region, as is also shown in the right hand side of FIG. 5.

As is clearly to be understood the above method can as well be implemented without the use of the sacrificial layer 31. Moreover, according to an embodiment, the thickness of the pattern layer may be less than the minimum height of the protruding portions. Accordingly, the pattern layer can be deposited as a conformal layer. By way of example, the thickness of the sacrificial layer is less than the minimum height of the protruding portions.

FIGS. 6 to 10 illustrate a further embodiment of the present invention. The starting point for implementing the second embodiment of the present invention is the structure shown in FIG. 2. In particular, on the surface 10 of a semiconductor substrate, in particular, a p-doped silicon substrate, a plurality of gate electrodes 2 as an example of protruding portions are formed. The height of each of the gate electrodes is approximately 100 to 500 nm depending on the minimal structural feature size of the technology employed. In a first step, a planarizing layer is deposited so as to entirely cover the gate electrodes 2. A carbon layer 51, e.g., is deposited by a chemical vapor deposition method. In particular, such a carbon layer is a layer which is made of elementary carbon, e.g., amorphous carbon, and which may optionally comprise hydrogen. Such a carbon layer may be deposited by physical vapor deposition or chemical vapor deposition.

As an alternative, also the bottom resist of a bi-layer resist system as is commonly used can be employed. In particular, such a bottom layer comprises aromatic carbon compounds, such as polymers, in particular, polymers on a novolak, polyhydroxystyrene, Naphtalene or/and Phenyl methacrylate basis. The thickness of the planarizing layer is such that the layer thickness is constant, independently from the loading density of the gate electrodes. For example, a layer thickness may be approximately 100 to 600 nm. The planarizing layer, e.g., may as well act as an antireflective coating.

The resulting structure is shown in FIG. 6. As can be seen, the entire surface of the substrate is covered with a planarizing layer 51. The planarizing layer 51, e.g., may be applied by spin coating, so that a homogeneous layer thickness is obtained.

In the next step, a recess etching step or a CMP step can be performed so that the layer thickness of the planarizing layer 51 is reduced. By way of example, the recess etching step may stop on the surface of the gate electrodes 2. FIG. 7 shows a cross-sectional view of the resulting structure, wherein the height of the recess etch 52 is shown. As is shown in FIG. 7, the upper surface of the layer 51 may be disposed above the upper surface of the gate electrodes 2.

In the next step, an imaging layer 53 is deposited on the surface of the planarizing layer 51. The imaging layer may have the thickness, e.g., of approximately 50 to 250 nm. Moreover, the imaging layer may comprise photoactive components so that it can be patterned using normal photolithographic methods. For example, the top resist layer of a bi-layer resist system as is usually employed may be taken. Such a top resist layer usually is made of a material which is not completely etched when etching the bottom layer. If the bottom layer, e.g., of a bi-layer resist system is etched using a reactive ion etching method, the top layer becomes insensitive with respect to this reactive ion etching and the top layer is etched at a much slower etch rate. Preferably, the imaging layer 53 further includes an additive so as to enhance the stopping power during the ion implantation step which is to follow. By way of example, such a top resist layer may include an additive such as silicon which is reacted to $SiO_2$ during the reactive ion etching step using $O_2$ as an etching gas. In particular, the imaging layer may comprise an organic compound, e.g., a hydrocarbon compound, including silicon at least in the main chains or side chains. In particular, if the imaging layer 53 includes silicon, the silicon is reacted during the ion implantation step to $SiO_2$ and, thus, has an increased stopping power with respect to the ions which are implanted. Optionally, the imaging layer 53 may also comprise titanium so as to further increase the stopping power. By way of example, the thickness of the imaging layer 53 may be reduced during the ion implantation step.

The resulting structure is shown in FIG. 8. As can be seen from FIG. 8, on the surface 10 of a semiconductor substrate gate electrodes 2 are formed. The gate electrodes 2 are entirely covered with the planarizing layer 51. On top of the planarizing layer 51, the imaging layer 53 is disposed. In the next step, the layer stack comprising the planarizing layer 51 and the imaging layer 53 is patterned in accordance with the portions of the substrate surface 10 which are to be exposed. In particular, the imaging layer 53 is patterned using a photolithographic method that is well known in the art, thereby removing predetermined portions of the imaging or pattern layer. In addition, an etching step is performed so as to remove the planarizing layer 51 from those portions from which the imaging layer 53 has been removed during the photolithographic step. After patterning this layer stack, an ion implantation step is performed for defining the first and second source/drain regions. In particular, this ion implantation step is an ion implantation step during which the ions perpendicularly impinge onto substrate surface 10. N dopants such as P or As ions, e.g., may be doped during this implantation step.

Thereafter, an angled ion implantation step 35 is performed. Preferably, an angle of the ions is 55 to 75°, e.g., 55 to 70° and, as a further example, 62° with respect to the substrate surface 10. This implantation step, e.g., may be performed with a p-dopant for example $BF_2$ or B ions. During this implantation step the planarizing layer 51 and, optionally, the imaging layer 53 act as an implantation stopping layer. As a result, only those portions which are not shadowed by the layer stack comprising the planarizing layer and the imaging layer 53 or by the gate electrodes 2 are implanted with the angled implantation step. If a bottom resist of a commonly used bi-layer resist system is taken as the planarizing layer, an improved stopping activity of this layer is obtained.

If such a bi-layer resist system is taken as an ion implantation mask, the sidewalls of the opened portions are steeper and better defined than in the usually employed photoresist material. Since the imaging layer 53 is scarcely eroded by the implantation step, the region in which the ions are implanted is defined more precisely. Since the layer stack comprising the planarizing layer 51 and the imaging layer 53 has a high stopping power with respect to the ions, the thickness of the layer stack can be reduced. As a consequence, even with reduced ground rules the method of the present invention can be implemented.

FIG. 9 shows a cross-sectional view of the ion implantation step. As can be seen, the ions impinge onto the substrate surface 10 in the opened regions at an angle α.

Thereafter, the imaging layer as well as the planarizing layer 51 are removed from the substrate surface. As a result, the cross-sectional view shown in FIG. 10 is obtained. As can be seen, a plurality of transistors are formed. Each of the transistors comprise a first and a second source/drain regions 21, 22, a gate electrode 2, and a channel 24 which is disposed between the first and second source/drain regions. The first and second source/drain regions are adjacent to the substrate surface 10. The gate electrode is insulated from the channel by a gate insulating layer 25. At the boundary of the first and second source/drain regions 21, 22 and the channel 24, the doped portion 42 is provided. The doped portion 42 is slightly p-doped so as to suppress short channel effects. Thereafter, the transistor array as is shown in FIG. 10 is completed in a conventional manner by providing the corresponding contacts and higher metallization layers.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF REFERENCE SYMBOLS 1 semiconductor substrate
10 substrate surface
2 gate electrode
2a gate electrode sidewall
21 first source/drain region
22 second source/drain region
23 transistor
24 channel
25 gate insulating layer
31 SiO2 layer
32 Si3N4 layer
32a Si3N4 spacer
33 patterned photoresist layer
34 patterned photoresist layer
35 tilted ion implantation
36 erosion portion
4 doped portion
41 protruding portion
42 halo doped region
51 planarizing layer
52 recess etch
53 imaging layer
6 memory cell array
60 memory cell
61 storage element
62 word line
63 bit line
7 peripheral portion
71 sense amplifier
72 word line driver
73 core circuitry
74 support portion

What is claimed is:

1. A method of forming a doped portion of a semiconductor, comprising:
providing a semiconductor substrate having a surface;
defining a plurality of protruding portions on the substrate surface, the protruding portions having a minimum height;
providing a sacrificial layer above the substrate surface;
providing a pattern layer above the sacrificial layer and the substrate surface;
removing portions of the pattern layer from predetermined substrate portions;
performing an ion implantation procedure such that an angle of the ions with respect to the substrate surface is less than 90°, wherein the ions are stopped by the pattern layer and by the protruding portions, the predetermined substrate portions thereby being doped with the ions; and
removing the pattern layer.

2. The method of claim 1, wherein the pattern layer is conformally deposited on the substrate surface.

3. The method of claim 1, wherein removing the portions of the pattern layer comprises:
covering predetermined portions of the pattern layer with a resist material, thereby defining uncovered portions of the pattern layer, and
anisotropic etching the pattern layer at the uncovered portions.

4. The method of claim 3, wherein the covering of predetermined portions with the resist material comprises:
providing a photoresist layer, and
photolithographically patterning the photoresist layer.

5. The method of claim 1, wherein a thickness of the pattern layer is less than the minimum height of the protruding portions.

6. The method of claim 1, wherein the pattern layer has a thickness of between 5-10 nm.

7. The method of claim 1, wherein the pattern layer comprises a material selected from the group consisting of: silicon nitride, tungsten, and TiN.

8. The method of claim 1, wherein the sacrificial layer is conformally deposited on the substrate surface.

9. The method of claim 1, wherein the thickness of the sacrificial layer is less than the minimum height of the protruding portions.

10. The method of claim 1, wherein the sacrificial layer has a thickness of between 5-30 nm.

11. The method of claim 1, wherein the sacrificial layer comprises silicon dioxide.

12. The method of claim 1, further comprising removing portions of the sacrificial layer from the predetermined substrate portions prior to performing the ion implantation.

13. The method of claim 12, wherein the thickness of the sacrificial layer is larger than the minimum height of the protruding portions.

14. The method of claim 13, further comprising removing an upper portion of the sacrificial layer.

15. The method of claim 14, wherein, after removing the upper portion of the sacrificial layer, a plane surface of the sacrificial layer is thereby obtained.

16. The method of claim 13, wherein the pattern layer includes a photoactive compound and predetermined portions of the pattern layer are removed by exposing the predetermined portions to electromagnetic radiation and dissolving the exposed portions in a suitable solvent.

17. The method of claim 12, wherein the sacrificial layer has a thickness of between 150-280 nm.

18. The method of claim 12, wherein the pattern layer has a thickness of between 50-250 nm.

19. The method of claim 18, wherein the pattern layer has a thickness of between 50-150 nm.

20. The method of claim 12, wherein the pattern layer comprises an organic compound.

21. The method of claim 20, wherein the pattern layer comprises a hydrocarbon compound comprising an additive selected from the group consisting of silicon and titanium.

22. The method of claim 21, wherein the sacrificial layer comprises a material selected from the group consisting of: an organic compound and an elementary carbon.

23. The method of claim 1, wherein defining a plurality of protruding portions includes forming a gate electrode on the substrate surface, the method further comprising:
forming a first and a second source/drain region in the semiconductor substrate such that a transistor is at least partially formed in the semiconductor substrate.

24. The method of claim 23, wherein the first and the second source/drain regions are defined via performing an ion implantation procedure that requires the pattern layer and the gate electrode to perform as an implantation mask, thereby stopping the implanted ions.

25. The method of claim 23, wherein the first and the second source/drain region are doped with ions having a first conductivity type and the angled ion implantation procedure is performed with ions having a second conductivity type, the second conductivity type being opposite to the first conductivity type.

* * * * *